US007411521B2

(12) United States Patent
Lewis et al.

(10) Patent No.: US 7,411,521 B2
(45) Date of Patent: Aug. 12, 2008

(54) CONTROL SYSTEM

(75) Inventors: Jason D. Lewis, Christchurch (GB); Alfred J. Alexander, Newport (GB); Andrew M. Craig, Bournemouth (GB); Dev K. Banerjee, Shirley (GB); Jolyon M. Crane, Christchurch (GB)

(73) Assignee: PG Drives Technologies Limited, Christchurch (GB)

( * ) Notice: Subject to any disclaimer, the term of this patent is extended or adjusted under 35 U.S.C. 154(b) by 336 days.

(21) Appl. No.: 11/198,384

(22) Filed: Aug. 5, 2005

(65) Prior Publication Data

US 2006/0028184 A1 Feb. 9, 2006

(51) Int. Cl.
*H03K 17/94* (2006.01)

(52) U.S. Cl. ..................... 341/32; 345/161; 273/148 R; 74/471 XY; 200/6 A

(58) Field of Classification Search ............. 324/207.2; 74/471 XY; 200/6 A; 345/161; 341/26; 273/148 R
See application file for complete search history.

(56) References Cited

U.S. PATENT DOCUMENTS 4,187,483 A 2/1980 Whitney
4,654,576 A 3/1987 Oelsch et al.
5,160,918 A 11/1992 Saposnik et al.
5,831,596 A * 11/1998 Marshall et al. ............. 345/161
5,850,142 A * 12/1998 Rountos et al. .......... 324/207.2
5,977,752 A 11/1999 Schulz

FOREIGN PATENT DOCUMENTS

DE 19756475 A1 6/1998
EP 0938035 A 8/1999
WO WO 2004/049092 A 6/2004

OTHER PUBLICATIONS

GB Search Report for Application No. GB0417668.1 dated Dec. 20, 2004 (1 p.).
PG Drives Technology Ltd., Annex To Form PCT/ISA/206 Communication Relating To The Results Of The Partial International Search mailed Sep. 21, 2005 for International Application No. PCT/GB2005/002859, 2 p.

* cited by examiner

*Primary Examiner*—Timothy Edwards, Jr.
(74) *Attorney, Agent, or Firm*—Conley Rose, P.C.

(57) ABSTRACT

A control system comprising a control input device having a movable magnet, a pole-piece frame arrangement positioned about the magnet and positioned therein at least two magnetic flux sensors for sensing movement of the magnet in a given direction. The control system further comprises a monitoring arrangement for monitoring the output signal of each of the sensors and permits the input device to control the system only when the output of the sensors are within a predefined range. This multiple sensing provides a fail-safe in the event that one of the sensors generates an erroneous signal.

46 Claims, 3 Drawing Sheets

CONTROL SYSTEM

BACKGROUND

This application claims priority to Great Britain Application No. 0417668.1, filed Aug. 6, 2004. The above-listed application is hereby incorporated in its entirety herein by reference for all purposes.

The present invention relates to a control system and more particularly to a joystick type control system, and particularly to such systems utilizing magnetic positional sensing used in safety critical human/machine control interfaces.

Various uses for joystick control systems, such as the present invention, include wheelchairs, forklift trucks or other man-carrying vehicles, and control of machines such as cranes, robots or other industrial equipment where a dangerous situation could exist in the event of a control system failure. In such a system, dual joystick position sensor channels may be used, and the outputs compared to one another continuously. This ensures that if there is a problem with one of the sensor channels, the error is picked up due to a mismatch in the outputs at the 2 channels. If a discrepant output (differential beyond a predetermined threshold) occurs, the control system rapidly and safely disables the system.

The force with which a user operates the controller and, to a lesser extent, manufacturing tolerances, can result in the joystick shaft shifting in position translationally in the three orthogonal directions (x,y,z). Due to such tolerances and the fact that the primary and back up sensor in each fail-safe pair cannot occupy exactly the same position in space, the outputs from the sensors in the pair will differ slightly and allowance must be made for this when setting the tolerance threshold. The sensors are typically programmable, allowing each pair to be calibrated to provide a zero difference in output from each sensor of the pair, under normal operating conditions. However, if the threshold is too small then the monitoring system may indicate a malfunction, creating false errors referred to as nuisance trips in the art.

Alternatively, the sensors in each pair could be arranged to provide outputs having opposite sense. In such an implementation, the output of one sensor of the pair could be arranged to provide a positive output, and the other sensor of the pair could be arranged to provide a negative output. However, in both arrangements, the sum of the outputs of the sensors in a given pair, or their mean, is required to be a constant to within the tolerance threshold.

For joystick systems of the magnetic sensing type, it is necessary to measure the angular position of the joystick shaft (and therefore the magnet) without introducing errors due to the linear motion of the magnet in the three orthogonal directions. There is thus a need for an improved control system.

BRIEF SUMMARY

Various apparatus and method embodiments of the invention are described herein. For example, in one embodiment of the invention, a control system comprising a control input device having a movable magnet, a pole-piece frame arrangement positioned about the magnet, and positioned therein at least two first magnetic flux sensors for sensing movement of the magnet along a first axis, a monitoring arrangement for monitoring the output signal of each of the at least two first sensors, wherein a process can be implemented dependant upon the monitored output signals of the at least two first sensors. This and other embodiments are disclosed herein. The preferred embodiments described herein do not limit the scope of this disclosure.

In various illustrative embodiments of the present invention, the monitoring arrangement processes together the output signals of the at least two first sensors, to generate a first check value, and wherein a fail-safe process can be implemented dependent upon the first check value.

In accordance with various embodiments of the present invention, the primary delivery route for magnetic flux to the sensors in respective pairs is via the pole-piece frame arrangement. Thus, the gap between the sensors and the magnet is greater than the gap between the magnet and specific portions of the pole-piece frame arrangement. The pole-pieces of the frame arrangement are manufactured of highly magnetically permeable, soft material, such as radiometal, mumetal or other similar material with low hysteresis. The pole-piece frame may comprise pole-piece elements in contact or spaced by small gaps.

In various embodiments, the pole-piece frame arrangement includes a first pair of gaps diametrically arranged about the magnet. The pole-piece frame may be spatially arranged to shield the sensors from, or minimize the influence of, unwanted components of flux which would generate unwanted differences between the outputs of each sensor of a given pair.

In still other embodiments, the control system further comprises at least two second magnetic flux sensors positioned in the pole-piece frame arrangement for sensing movement of the magnet about a second axis, a monitoring arrangement for monitoring the output signal of each of the at least two second sensors to generate a second check value, wherein a process can be implemented dependant upon the monitored output signals of the at least two second sensors.

In a control system according to embodiments of the present invention, the first sensor pair is used to monitor angular movement of the control input device in a first axis, and the second sensor pair is used to monitor angular movement in a second axis. In various embodiments, the first and second sensor pairs are spaced at ninety degrees (90°) about the magnet.

A fail-safe control output may be provided dependent upon the monitored difference in output between the sensors in each pair. The fail-safe control output may be dependent upon the monitored difference in output between the sensors in each pair reaching or exceeding a predetermined threshold value.

The monitoring arrangement monitors the difference in output between sensors in different pairs, to ascertain the angular position of the magnet with respect to the pole-piece frame.

For each sensor pair, Hall effect sensors are mounted in side-against-side configuration in respective first and second gaps in the pole-piece frame arrangement. The sensors may be sandwiched between spaced facing flanges of the pole-piece frame. The spaced facing flanges may be more extensive than the sensors, reducing the risk of magnetic field distortion at the sensors which may otherwise be present due to, for example, edge effects.

The pole-piece frame may include specific flux collector elements disposed nearer to the magnet than the sensors are disposed to the magnet. The flux collector elements may be substantially planar panels. In one embodiment, the planar panel flux collector elements may be supported by narrower connection arms of the pole-piece frame arrangement.

In various embodiments, the pole-piece frame arrangement includes pole piece lengths extending substantially perpendicularly with respect to one another. In this arrangement the lengths beneficially extend at forty five degrees (45°) to the axis through an intermediate sensor pair and the magnet.

A sensor pair may be therefore positioned in a gap between the mutually perpendicularly extending pole-piece lengths.

In various embodiments, the pole-piece frame arrangement includes a pole-piece element positioned intermediate to one or both sensor pairs and the magnet. This pole piece element is therefore provided forwardly (magnet-side) of a sensor pair, and acts to shield the behind positioned sensor from direct flux from the magnet. This shield collector pole-piece carries flux to pass through the alternative pair of sensors.

The control input device may comprise a joystick shaft. The joystick shaft has a ball mount, the magnet being embedded within the ball. The ball is mounted on a bearing socket, comprising the controller.

In various illustrative embodiments, the invention comprises a joystick control device comprising a movable magnet, and a pole-piece frame arrangement positioned about the magnet, the pole-piece frame arrangement including at least one pair of gaps diametrically arranged about the magnet, and positioned therein at least two magnetic flux sensors.

The monitoring arrangement comprises a processing system for receiving, processing and producing output control signals in response to sensor input.

In still further embodiments, there is provided a control system comprising a control input device having a movable magnet, a pole-piece frame arrangement positioned about the magnet, and positioned therein at least one magnetic flux sensor, wherein the at least one magnetic flux sensor is housed in a screening can arrangement to direct magnetic flux away from the at least one sensor when the control input device is in the null position.

The screening can ensures that when the joystick is in the zero, upright position, any flux flowing from the pole piece to the screening can does not pass through the sensors (or at least is minimized). In addition, the screening can provides mechanical stability and preferably reduces any magnetic flux external to the cans from entering the magnetic flux sensors and affecting their outputs. In various embodiments, the screening can arrangement is symmetric.

In other illustrative embodiments, there is provided a control system comprising a control input device having a movable magnet, a pole-piece frame arrangement positioned about the magnet, and positioned therein at least one magnetic flux sensor, wherein the pole-piece frame includes flux collector elements disposed more closely to the magnet than the sensors are disposed to the magnet.

NOTATION AND NOMENCLATURE

Certain terms are used throughout the following description and claims to refer to particular system components. Persons skilled in the art will appreciate that components may be denoted in the art by different names. The present invention includes within its scope all components, however denoted in the art, that achieve the same function. In the following discussion and in the claims, the terms "including" and "comprising" are used in an open-ended fashion, and thus should be interpreted to mean "including, but not limited to." Also, the terms "couple," "couples" or "coupled" are intended to refer to either an indirect or direct connection. Thus, if a first device couples to a second device, that connection may be through a direct connection, or through an indirect connection via other devices and connections.

BRIEF DESCRIPTION OF THE DRAWINGS

The invention will now be further described in specific embodiments by way of example only, and with reference to the accompanying drawings in which.

DETAILED DESCRIPTION

The present invention is amenable to implementation in various embodiments. The disclosure of specific embodiments, including preferred embodiments, is not intended to limit the scope of the invention as claimed unless expressly specified. In addition, persons skilled in the art will understand that the invention has broad application. Accordingly, the discussion of particular embodiments is meant only to be exemplary, and does not imply that the scope of the disclosure, including the claims, is limited to specifically disclosed embodiments.

Figure 1:
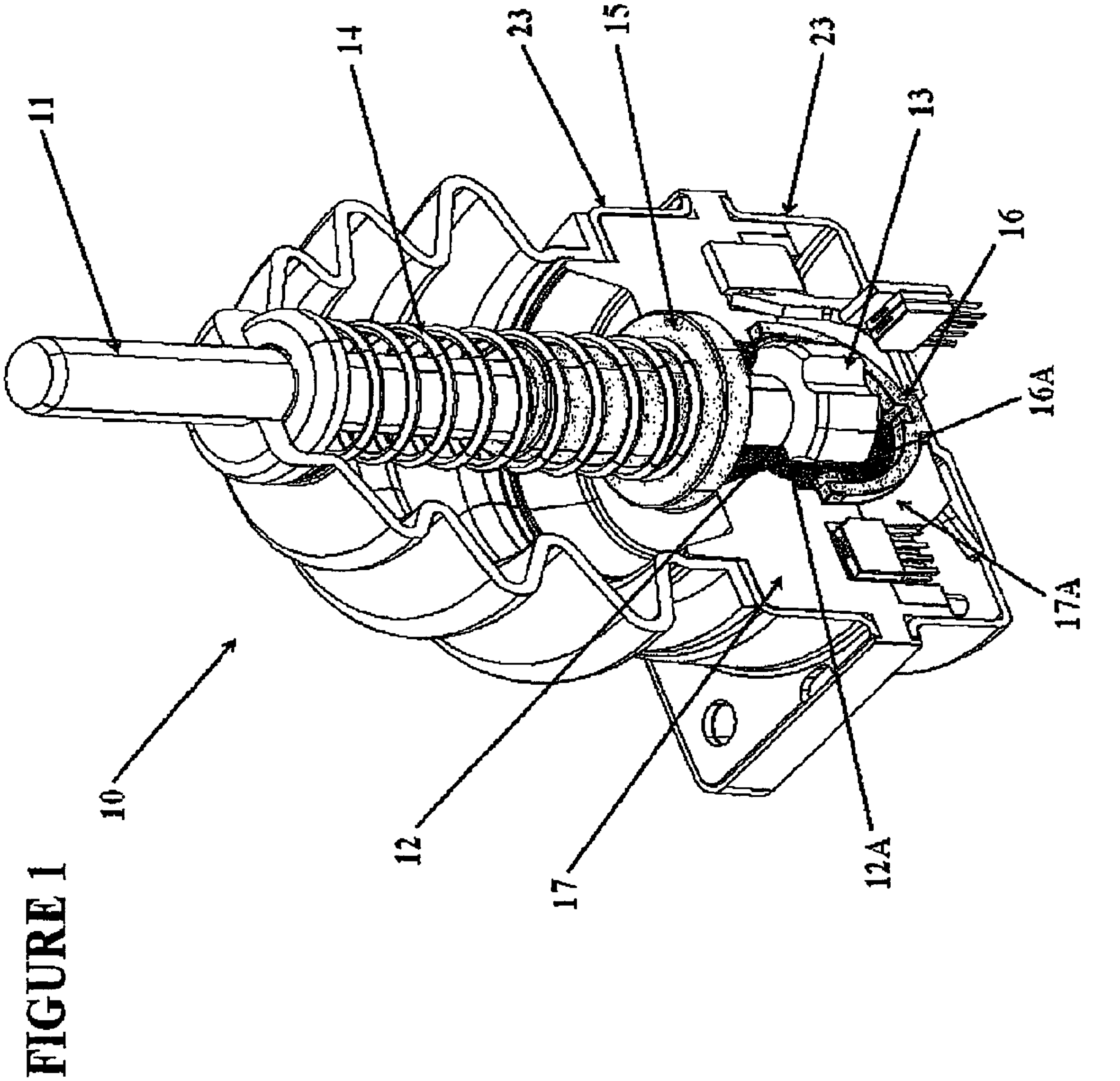
FIG. 1 is a cut-away section of an exemplary device used in the control system of the invention.

Referring to FIG. 1 of the drawings, the control input device 10 comprises a shaft 11, one end of which is attached to a ball 12, in which there is a molded magnet 13. The molded magnet may comprise neodynium-iron-boron (NdFeB), samarium cobalt (SmCo), ferrite or other permanent magnetic material. The ball 12 is situated in a socket (not shown) and the shaft 11 is biased to the central upright position by means of a spring 14 and sliding bush 15, which may be conical or flat.

The magnet 13 is oriented within the ball 12 such that the axis of magnetization is along the axis of the shaft 11. The ball 12 further comprises two diametrically opposite recesses 16A for accommodating a stirrup clip 16. The clip 16 fits into matching groove 16B formed on the main body 17 of the input device 10 to prevent the rotation of the shaft 11 about its long axis.

Figure 2:
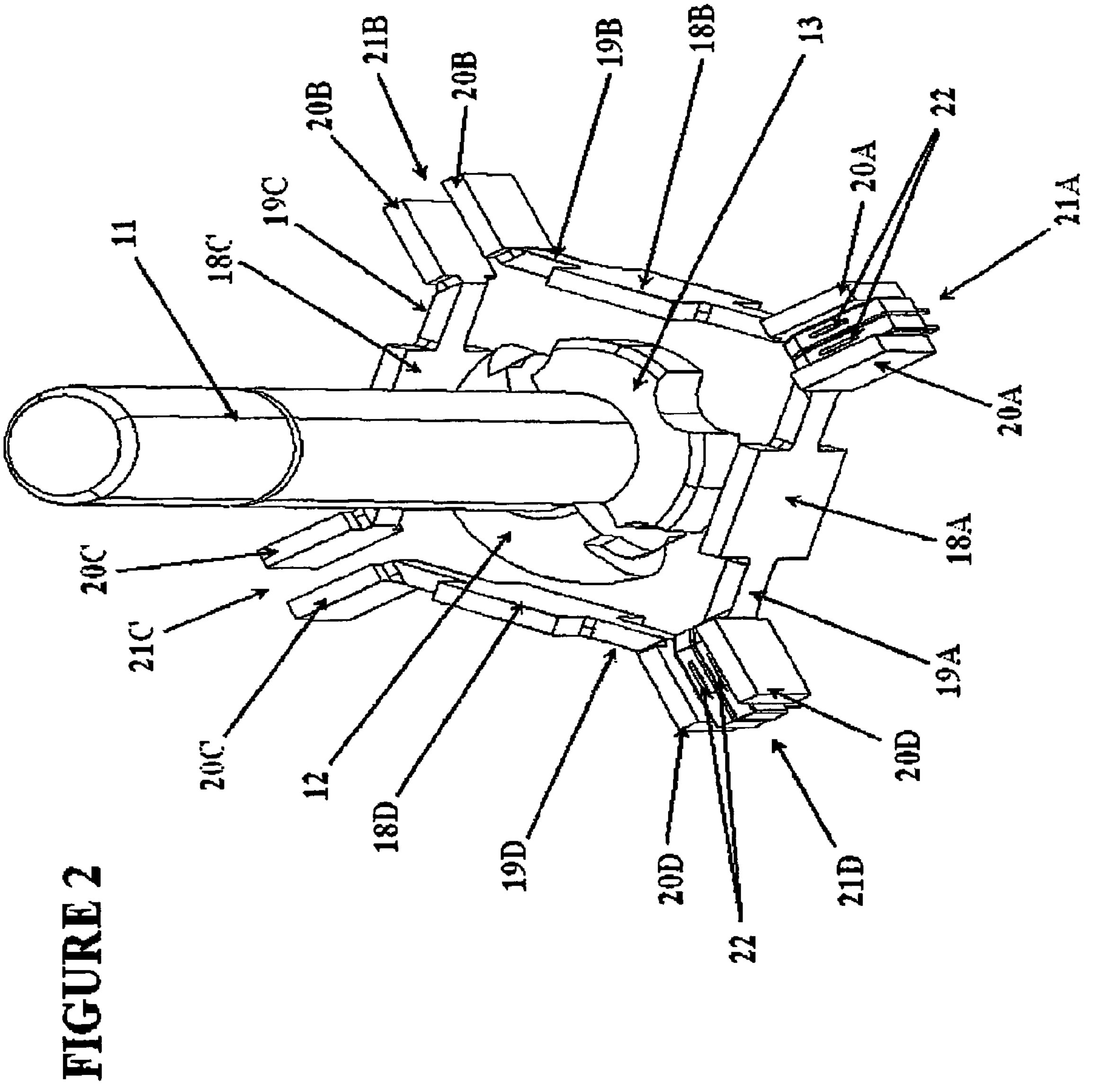
FIG. 2 is a perspective view of a first embodiment of an exemplary control device in accordance with the invention.

Referring to FIG. 2, in accordance with a first embodiment of the invention, the ball 12 is surrounded by a pole-piece frame arrangement which lies in the plane that is substantially perpendicular to the axis of the shaft 11. The pole-piece frame arrangement is formed of a material with a high magnetic permeability and comprises four collector plates 18A, 18B, 18C, 18D, equally spaced around the magnet supported by four pole-piece arms 19A, 19B, 19C, 19D which have a comparatively smaller frame area than the plates 18. The collector plates 18 and arms 19 are oriented such that their plane is substantially parallel to the axis of the shaft 11 in its un-deflected upright position. In various embodiments, the pole-piece frame arrangement may be square with the corners of the arms turned outwardly from the magnet 13 with four pairs of plates 20A, 20B, 20C, 20D, along a parallel to the square diagonal, forming gaps 21A, 21B, 21C, 21D, there between.

In two of the gaps 21 that have a common adjoining side of the pole-piece frame arrangement (i.e. 21A and 21D), there may be placed a pair of identical Hall effect sensors 22, aligned side to side, to sense the flux component in the direction perpendicular to the pole faces forming the gap. The sensors are separately used to detect either right and left, or forward and aft movement of the shaft 11 and generate the appropriate signal to the controlled device. However, the input conveyed by the user on the shaft 11 is only enabled if the difference in flux measured in each sensor of the pair is within a tolerance threshold. The tolerance threshold takes into account any unintentional translational (x,y,z) movement of the ball 12 within the socket 13, any flux distortions within the gap, remanent flux within the pole piece, any misalignment of the sensors, non-homogeneity of the magnet and any external magnetic fields which could influence the sensing. The sensors (arranged as a pair, triplet, quadruplet and so on) ensure that in the event of a failure of one of the sensors, or an erroneous signal output from one of the sensors 22, the difference between the sensor outputs is greater than the tolerance threshold. A fail-safe process may then be implemented and no control signal will be generated. The system controlled by the input device will then be disabled.

The relative dimensions of the sensing element of the Hall effect sensors 22 and the pairs of plates 20A, 20B, 20C, 20D ensure that the flux passing from one plate of the gap 21 to the opposite plate of the same gap passes through both sensing elements of the Hall effect sensors 22. To enable the flux to pass through both sensing elements of the Hall effect sensors, the smaller area sensing elements housed within the Hall effect sensors 22 may be placed central to the larger area plates 20A, 20B, 20C, 20D to avoid the distorted flux trajectory near the plate edges.

The pole-piece frame arrangement may be configured such that the collector plates 18A, 18B, 18C, 18D, are the closest parts of the frame arrangement to the magnet 13. The collector plates 18A, 18B, 18C, and 18D may be arranged to pick up a change in magnetic flux, as opposed to the smaller area arms 19, in accordance with the angular disposition of the shaft 11 from the upright position or a flux change directly influencing the sensor pairs 22.

In use, the angular movement of the shaft 11 toward a first gap creates a magnetic potential difference within the pole-piece frame which causes flux to flow symmetrically around the circuit to the diagonally opposite gap of the pole-piece arrangement. For example, the angular movement of the shaft in the direction of gap 21A will cause collector plates 18A and 18B to experience more "North-pole" than collector plates 18C and 18D, which both experience more "South-pole". In this manner, a flux will pass across the gaps 21B and 21D. Since plate pairs 20A and 20C are at the same magnetic potential separately, no flux will pass across gaps 21A and 21C. However, a pair of sensors located within gap 21D will experience a flux change and thus generate an electrical signal due to the Hall effect, thereby indicating the desired input control.

Figure 3:
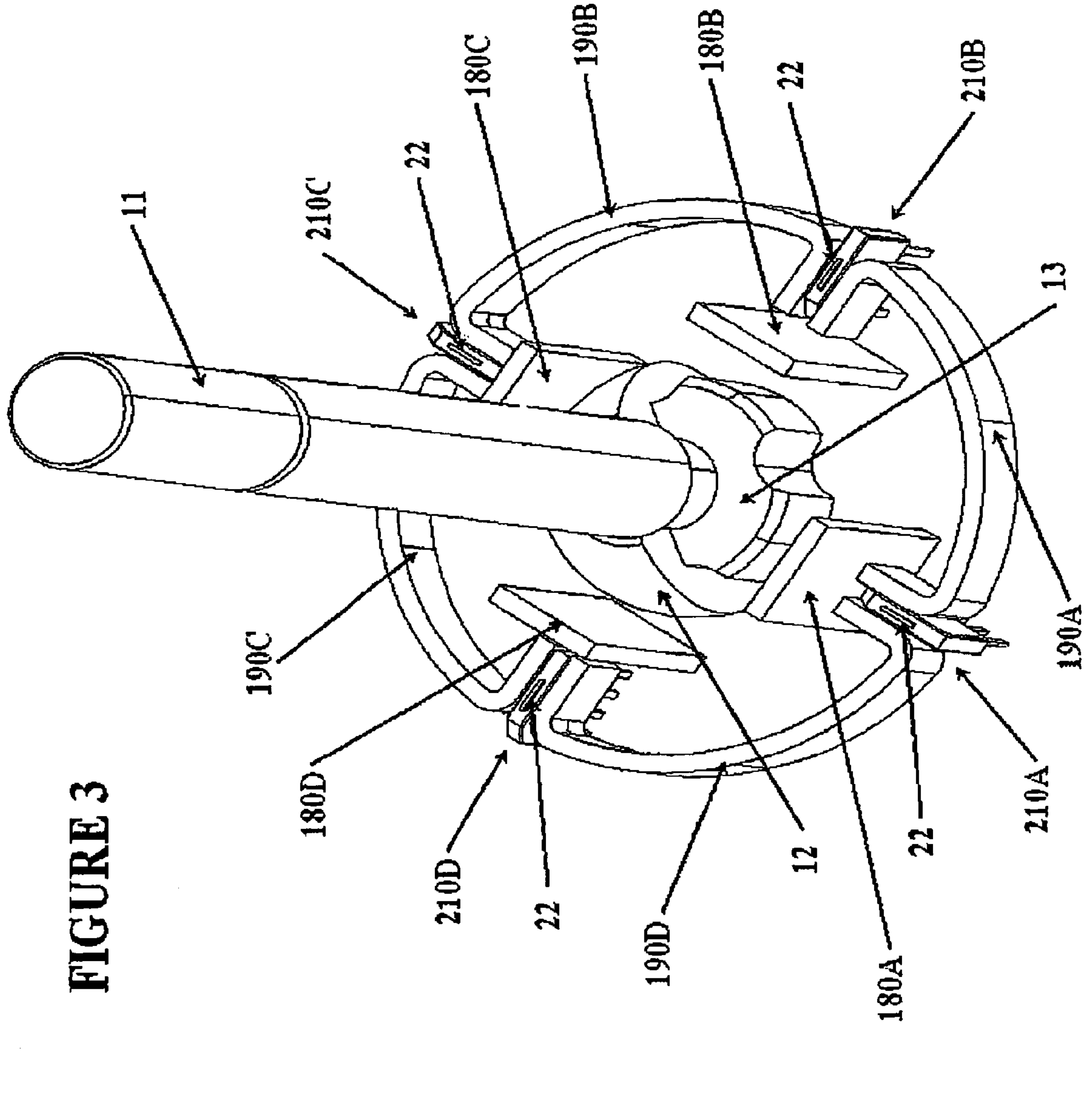
FIG. 3 is a perspective view of a second embodiment of an exemplary control device in accordance with the invention.

Referring to FIG. 3 of the drawings, in accordance with another embodiment of this invention, the magnet 13 is surrounded by a pole-piece frame arrangement which lies in a plane that is substantially perpendicular to the axis of the shaft 11. The pole-piece frame arrangement is formed of a material with a high magnetic permeability and comprises four magnetic shields/collector plates 180A, 180B, 180C, 180D, equally spaced around the magnet.

In various embodiments, the pole-piece frame arrangement may be circular and split into four quadrants by four pole-piece arms 190A, 190B, 190C, 190D which have a comparatively smaller frame area than the plates 180. The end of each arm 190 is turned inwardly toward the magnet 13 but is shielded from the magnet 13 by the plates 180.

The inward protuberance at the ends of the pole-piece arms 190 form four gaps 210A, 210B, 210C, 210D there between, equally spaced around the magnet. Within each gap is placed a Hall effect sensor 22 such that opposing pairs are arranged to detect either forward/aft or left/right deflection of the shaft 11.

In use, the angular movement of the shaft 11 toward a first gap creates a magnetic potential difference within the pole-piece frame, which causes flux to flow symmetrically around the circuit to the diagonally opposite gap of the pole-piece arrangement. For example, the deflection of the shaft 11 in the direction of the gap 210A will cause the magnetic potential at the protuberances of arms 190A and 190D forming gap 210A to become more "North-pole" than the protuberances of arms 190B and 190C forming gap 210C, which experience more "South-pole". In this manner the flux lines will flow around the pole-piece frame arrangement from gap 210A to 210C, passing through the Hall sensor in gap 210B and 210D, thereby generating a signal to activate the desired control. The plates 180 placed between the magnet 13 and gaps 210 prevent the flux of the magnet from directly reaching the sensors 22 within the gaps 210 and thereby ensure that the flux in the gaps 210 is uniform and independent of the flux from the magnet. The plates collect the flux from the magnet and channel the flux toward each protuberance of the respective arm 190 thereby prevent the flux from penetrating the gap directly from the magnet.

The input conveyed by the user on the shaft 11 is only enabled, however, if the flux measured in one sensor of the opposing pair is within a threshold tolerance of that measured in the second sensor of the same pair. The tolerance threshold takes into account any unintentional translational (x,y,z) movement of the ball 12 within the socket 13, any flux distortions within the gap, remnant flux within the pole piece, any misalignment of the sensors, non-homogeneity of the magnet and any external magnetic fields which could influence the sensing. The sensors (arranged as a pair, triplet, quadruplet, and so on) ensure that in the event of a failure of one of the sensors, or an erroneous signal as the output from one of the sensors 22, the difference between the sensor outputs is greater than the tolerance threshold. A fail-safe process is then implemented and no control signal will be generated. The system controlled by the input device will then be disabled.

In these embodiments described, the pole-piece frame arrangement acts as the primary conduit to pick up and divert magnetic flux across the respective pairs of Hall effect sensors 22. This ensures that, as far as practicable, the individual sensors in each pair experience the same flux and therefore, in the absence of system failure, substantially the same output is generated for each of the sensors in a respective pair. This occurs irrespective of translational movement of the shaft 11 and magnet 13 in x, y or z directions relative to the positioning of the collectors 18 on the pole-piece frame. In various embodiments, movement in the x, y and z directions may be compensated for by the square frame nature of the pole-piece frame arrangement (since the collector plates 18 are at forty-five degree (45°) angles from the shaft sensor sensitive axis, and therefore two plates 18 simultaneously pick up the flux components). In various other embodiments, translational movement in the x, y and z direction may be compensated for by the shield/collector plates 180 which are at ninety degrees (90°) about the shaft axis.

In all of the above embodiments, the magnetic sensing arrangement may be enclosed within symmetric screening cans 23. The cans 23 ensure that when the joystick is in the zero, upright position, any flux flowing from the pole-piece to the screening cans does not pass through the sensors (or at least, is minimized). Once the upper and lower cans are introduced into an effective proximity to the magnetic pole-piece arrangement, the pole-pieces which deliver the flux to the sensors all remain at the same magnetic potential with respect to each other. As a result, when the joystick is in the upright position, the flux circulating through the sensors is minimized. In addition, the cans 23 provide mechanical stability and help to reduce any magnetic flux external to the cans 23 from entering the magnetic sensing arrangement and affecting the sensor outputs.

While the preferred embodiments of the present invention have been shown and described, modifications thereof can be made by persons skilled in the art without departing from the spirit and teachings of the invention. The embodiments described herein are exemplary only, and are not intended to limit the scope of protection provided herein. For example, it should be appreciated that whilst the embodiments described here refer to control system input devices having a pair of sensors 22 for safety critical control in a given direction, more than two sensors could equally be used for "fail-safe" redundant operation.

What is claimed is:

1. A control system, comprising;

a control input device having a movable magnet;

a pole-piece frame arrangement positioned about the magnet, and positioned therein at least two first magnetic flux sensors for sensing movement of the magnet along a first axis, said at least two first magnetic flux sensors being positioned about said magnet such that, in the absence of failure of one of said flux sensors, the flux measured by said at least two first magnetic flux sensors is substantially the same within a predetermined threshold value;

a monitoring arrangement for monitoring the output signal of each of the at least two first sensors;

wherein the output of said at least two magnetic flux sensors is compared and a control input signal representative of movement of the control input device is only transmitted to a control process if the difference between said outputs of said at least two first magnetic flux sensors is less than said predetermined threshold value.

2. The control system of claim 1, wherein a fail-safe process is implemented in the event that said difference between said outputs of said at least two first magnetic flux sensors is greater than said predetermined threshold value.

3. The control system of claim 1, wherein said process comprises a control process.

4. The control system of claim 1, wherein the monitoring arrangement processes together the output signals of the at least two first sensors, to generate a first check value, and wherein the process can be implemented dependent upon the first check value.

5. The control system of claim 1, wherein the magnetic flux sensors are Hall effect sensors.

6. The control system of claim 1, wherein the pole-piece frame arrangement includes a first pair of gaps diametrically arranged about the magnet.

7. The control system of claim 6, wherein the magnetic flux sensors are arranged in diametrically opposing gaps of said pair.

8. The control system of claim 6, wherein the magnetic flux sensors are arranged in the same gap of said pair.

9. The control system of claim 1, wherein said system further comprises:

at least two second magnetic flux sensors positioned in the pole-piece frame arrangement for sensing movement of the magnet about a second axis, a monitoring arrangement for monitoring the output signal of each of the at least two second sensors to generate a second check value, wherein a process can be implemented dependant upon the monitored output signals of the at least two second sensors.

10. The control system of claim 9, wherein said process comprises a fail-safe process.

11. The control system of claim 9, wherein said process comprises a control process.

12. The control system of claim 9, wherein the monitoring arrangement processes together the output signals of the at least two second sensors to generate a second check value wherein a process can be implemented dependant upon the second check value.

13. The control system of claim 9, wherein the pole-piece frame arrangement includes a second pair of gaps diametrically arranged about the magnet.

14. The control system of claim 9, wherein the first and second at least two sensors are spaced at ninety degrees (90°) about the magnet.

15. The control system of claim 10, wherein the fail-safe is provided dependent upon the monitored difference in output signal between the at least two first sensors and/or between the at least two second sensors.

16. The control system of claim 10, wherein the fail-safe is provided dependent upon the monitored average of the output signals of the at least two first sensors and/or the monitored average of the output signals of the at least two second sensors.

17. The control system of claim 9, wherein the monitoring arrangement monitors the output of one sensor of said at least two first and second sensors, to ascertain the angular position of the magnet with respect to the frame.

18. The control system of claim 9, wherein the monitoring arrangement averages the output of each sensor of said at least two first and second sensors, to ascertain the angular position of the magnet with respect to the frame.

19. The control system of claim 6, wherein the sensors are mounted in side to side configuration in respective first pair of gaps in the pole-piece arrangement.

20. The control system of claim 6, wherein the sensors are sandwiched between one or more spaced facing flanges of the pole-piece frame.

21. The control system of claim 20, wherein the spaced facing flanges are more extensive than the sensing elements of the sensors.

22. The control system of claim 6, wherein a primary delivery route for magnetic flux to the sensors in the respective first pair of gaps is via the pole-piece frame arrangement.

23. The control system of claim 1, wherein the pole-piece frame comprises flux collector elements disposed nearer to the magnet than the sensors are disposed to the magnet.

24. The control system of claim 23, wherein the flux collector elements are substantially planar panels.

25. The control system of claim 23, wherein the flux collector elements are supported by narrower connection arms of the pole-piece frame arrangement.

26. The control system of claim 1, wherein the pole-piece frame arrangement comprises pole-piece lengths extending substantially perpendicularly with respect to one another.

27. The control system of claim 26, wherein said at least two sensors are positioned between the perpendicularly extending pole-piece lengths.

28. The control system of claim 9, wherein the pole-piece flame arrangement comprises a pole-piece element positioned intermediate to one or both of said at least two first and second sensors and the magnet.

29. The control system of claim 9, wherein the at least two first and second magnetic flux sensors are housed in one or more screening cans such that magnetic flux passing through the sensors is minimized when the control input device is in the null position.

30. The control system of claim 1, wherein the control input device comprises a joystick.

31. The control system of claim 30, wherein the joystick has a ball mount, the magnet being disposed within the ball.

32. A joystick control device, comprising:

a movable magnet, and a pole-piece frame arrangement positioned about the magnet, the pole-piece flame arrangement including at least one pair of gaps diametrically arranged about the magnet, and positioned therein at least two magnetic flux sensors.

33. The joystick control device of claim 32, wherein the magnetic flux sensors comprise Hall effect sensors.

34. A control system, comprising:

a control input device having a movable magnet;

a pole-piece frame arrangement positioned about the magnet, and positioned therein at least one magnetic flux sensor, wherein the at least one magnetic flux sensor is housed in one or more screening cans such that magnetic flux is directed away from the at least one sensor when the control input device is in the null position.

35. The control system of claim 34, wherein said screening cans are symmetric.

36. The control system of claim 34, wherein said screening cans minimizes unwanted magnetic flux through the magnetic flux sensors.

37. The control system of claim 34, wherein said screening cans provides mechanical stability.

38. A control system, comprising:

a control input device having a movable magnet;

a pole-piece frame arrangement positioned about the magnet, and positioned therein at least one magnetic flux sensor, wherein the pole-piece flame includes flux collector elements disposed more closely to the magnet than the sensors are disposed to the magnet.

39. The control system of claim 38, wherein the flux collector elements are substantially planar panels.

40. The control system of claim 38, wherein the planar panel flux collector elements are supported by narrower connection arms of the pole-piece frame arrangement.

41. The control system of claim 38, wherein the pole-piece frame arrangement includes pole-piece lengths extending substantially perpendicularly with respect to one another.

42. The control system of claim 41, wherein said at least one sensor is positioned between the mutually perpendicularly extending pole-piece lengths.

43. The control system of claim 38, wherein the pole-piece frame includes a pole-piece element positioned intermediate one or both of at least two first and second sensors and the magnet.

44. A control system, comprising:

a control input device having a movable magnet;

a pole-piece frame arrangement positioned about the magnet, and positioned therein at least two first magnetic flux sensors for sensing movement of the magnet along a first axis;

a monitoring arrangement for monitoring the output signal of each of the at least two first sensors;

wherein a process can be implemented dependent upon the monitored output signals of the at least two first sensors;

and wherein the pole-piece frame arrangement includes one or more air gaps, said at least two first magnetic flux sensors being arranged in the same air gap such that they measure substantially the same flux.

45. A control system, comprising:

a control input device having a movable magnet;

a pole-piece frame arrangement positioned about the magnet, and positioned therein at least two first magnetic flux sensors for sensing movement of the magnet along a first axis;

a monitoring arrangement for monitoring the output signal of each of the at least two first sensors;

wherein a process can be implemented dependent upon the monitored output signals of the at least two first sensors;

wherein the monitoring arrangement processes together the output signals of the at least two magnetic flux sensors, to generate a first check value, and wherein the process can be implemented dependent upon the first check value.

46. A control system, comprising:

a control input device having a movable magnet;

a pole-piece frame arrangement positioned about the magnet, and positioned therein at least two first magnetic flux sensors for sensing movement of the magnet along a first axis;

a monitoring arrangement for monitoring the output signal of each of the at least two first sensors;

wherein a process can be implemented dependent upon the monitored output signals of the at least two first sensors;

wherein the monitoring arrangement processes together the output signals of the at least two magnetic flux sensors, to generate a first check value, and wherein the process can be implemented dependent upon the first check value;

and wherein the system further comprises:

at least two second magnetic flux sensors positioned in the pole-piece frame arrangement for sensing movement of the magnet along a second axis; and a monitoring arrangement for monitoring the output signal of each of the at least two second sensors to generate a second check value, wherein a process can be implement dependent upon the second check value.

* * * * *